US012434348B2

(12) United States Patent
Reedy et al.

(10) Patent No.: US 12,434,348 B2
(45) Date of Patent: Oct. 7, 2025

(54) RETAINING RING HAVING INNER SURFACES WITH FEATURES

(71) Applicant: Applied Materials, Inc., Santa Clara, CA (US)

(72) Inventors: Steven Mark Reedy, San Ramon, CA (US); Simon Yavelberg, Cupertino, CA (US); Jeonghoon Oh, Saratoga, CA (US); Steven M. Zuniga, Soquel, CA (US); Andrew J. Nagengast, Sunnyvale, CA (US); Samuel Chu-Chiang Hsu, Palo Alto, CA (US); Gautam Shashank Dandavate, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/736,281

(22) Filed: Jun. 6, 2024

(65) Prior Publication Data

US 2024/0316723 A1 Sep. 26, 2024

Related U.S. Application Data

(60) Division of application No. 17/945,932, filed on Sep. 15, 2022, now Pat. No. 12,048,981, which is a (Continued)

(51) Int. Cl.
*B24B 37/32* (2012.01)
*H01L 21/687* (2006.01)

(52) U.S. Cl.
CPC ........ *B24B 37/32* (2013.01); *H01L 21/68721* (2013.01)

(58) Field of Classification Search
CPC .......................... B24B 37/32; H01L 21/68721
(Continued)

(56) References Cited

U.S. PATENT DOCUMENTS 3,038,279 A * 6/1962 Becker .................. B24D 13/16 51/297
4,768,861 A * 9/1988 Epner ...................... G02B 5/09 219/121.64
(Continued)

FOREIGN PATENT DOCUMENTS

CN 1748293 3/2006
CN 1890054 1/2007
(Continued)

OTHER PUBLICATIONS

Machine translation of KR-20070027897-A (Year: 2007).*
(Continued)

*Primary Examiner* — Robert F Neibaur
(74) *Attorney, Agent, or Firm* — Fish & Richardson P.C.

(57) ABSTRACT

Some implementations of a retaining ring has an inner surface having a first portion formed of multiple planar facets and a second portion that adjoins the first portion along a boundary and includes a frustoconical surface that is sloped downwardly from outside in. Some implementations of the retaining ring have a crenellated or serpentine inner surface, and/or an inner surface with alternating region of different surface properties or different tilt angles.

7 Claims, 10 Drawing Sheets

Related U.S. Application Data continuation of application No. 16/708,287, filed on Dec. 9, 2019, now Pat. No. 11,453,099, which is a division of application No. 14/992,763, filed on Jan. 11, 2016, now Pat. No. 10,500,695.

(60) Provisional application No. 62/168,578, filed on May 29, 2015.

(58) Field of Classification Search
USPC .......................................................... 451/398
See application file for complete search history.

(56) References Cited

U.S. PATENT DOCUMENTS

| | | | | |
|---|---|---|---|---|
| 4,932,733 | A | 6/1990 | Loy | |
| 5,695,392 | A * | 12/1997 | Kim | B24B 57/02 451/286 |
| 5,738,574 | A | 4/1998 | Tolles et al. | |
| 6,068,548 | A | 5/2000 | Vote | |
| 6,143,127 | A * | 11/2000 | Perlov | B24B 37/32 451/286 |
| 6,183,354 | B1 | 2/2001 | Zuniga et al. | |
| 6,251,215 | B1 | 6/2001 | Zuniga et al. | |
| 6,267,655 | B1 * | 7/2001 | Weldon | B24B 37/32 451/307 |
| 6,436,228 | B1 | 8/2002 | Zuniga et al. | |
| 6,663,468 | B2 | 12/2003 | Kawamura et al. | |
| 6,716,299 | B1 * | 4/2004 | Gotkis | B24B 21/04 156/345.12 |
| 6,857,945 | B1 | 2/2005 | Chen et al. | |
| 6,913,669 | B2 | 7/2005 | Ensinger | |
| 6,916,226 | B2 | 7/2005 | Moloney et al. | |
| 7,575,504 | B2 | 8/2009 | Zuniga et al. | |
| 7,740,521 | B2 * | 6/2010 | Hashimoto | B24B 37/30 451/63 |
| 8,328,454 | B2 | 12/2012 | McAndrews et al. | |
| 8,388,412 | B2 * | 3/2013 | Prabhu | B24B 37/32 451/41 |
| 8,870,626 | B2 | 10/2014 | Wang | |
| 9,152,902 | B2 | 10/2015 | Timm et al. | |
| 9,368,371 | B2 * | 6/2016 | Oh | B24B 37/32 |
| 10,500,695 | B2 | 12/2019 | Reedy et al. | |
| 11,056,350 | B2 | 7/2021 | Oh et al. | |
| 11,400,560 | B2 | 8/2022 | Oh et al. | |
| 11,453,099 | B2 | 9/2022 | Reedy et al. | |
| 12,033,865 | B2 | 7/2024 | Reedy et al. | |
| 12,048,981 | B2 | 7/2024 | Reedy et al. | |
| 2001/0007795 | A1 | 7/2001 | Kawamura et al. | |
| 2001/0051500 | A1 * | 12/2001 | Homma | B24B 37/30 451/286 |
| 2003/0162486 | A1 * | 8/2003 | Stoeckgen | B24B 53/017 451/289 |
| 2003/0224703 | A1 | 12/2003 | Moloney et al. | |
| 2004/0011293 | A1 | 1/2004 | Johnson et al. | |
| 2004/0152403 | A1 * | 8/2004 | Marohl | B24B 37/32 451/442 |
| 2004/0203325 | A1 | 10/2004 | Donohue | |
| 2005/0113002 | A1 * | 5/2005 | Chen | B24B 37/32 451/42 |
| 2005/0126708 | A1 * | 6/2005 | Chen | B24B 37/32 156/345.14 |
| 2006/0046621 | A1 * | 3/2006 | Phang | B24B 37/32 451/41 |
| 2007/0044913 | A1 * | 3/2007 | Wang | B24B 37/32 156/345.12 |
| 2008/0090497 | A1 | 4/2008 | Wang | |
| 2009/0021024 | A1 * | 1/2009 | Prabhu | B24B 37/32 411/517 |
| 2010/0035523 | A1 * | 2/2010 | Shirasu | B24B 37/32 451/285 |
| 2010/0120335 | A1 | 5/2010 | Fang et al. | |
| 2011/0151755 | A1 * | 6/2011 | Burns | B24B 37/32 451/286 |
| 2012/0041458 | A1 * | 2/2012 | Paganon | A61F 5/0056 606/151 |
| 2012/0309276 | A1 * | 12/2012 | Kim | B24B 37/32 451/364 |
| 2013/0035022 | A1 * | 2/2013 | Paik | B24B 37/32 451/364 |
| 2013/0115858 | A1 | 5/2013 | Zuniga et al. | |
| 2013/0165028 | A1 | 6/2013 | Sather et al. | |
| 2013/0324017 | A1 * | 12/2013 | Rahmathullah | B24B 37/32 451/398 |
| 2014/0123469 | A1 | 5/2014 | Han | |
| 2014/0134929 | A1 | 5/2014 | Lien et al. | |
| 2014/0287662 | A1 * | 9/2014 | Rahmathullah | B24B 37/32 451/398 |
| 2015/0303070 | A1 * | 10/2015 | Oh | B24B 41/06 216/53 |
| 2016/0151879 | A1 * | 6/2016 | Oh | B24B 37/04 451/287 |
| 2016/0243670 | A1 * | 8/2016 | Fukushima | B24B 37/32 |
| 2016/0271750 | A1 * | 9/2016 | Hu | B24B 37/32 |
| 2016/0346897 | A1 | 12/2016 | Reedy et al. | |
| 2017/0120414 | A1 * | 5/2017 | Tsai | B24B 53/12 |
| 2018/0264621 | A1 * | 9/2018 | Yoo | H01L 21/68721 |
| 2019/0099857 | A1 | 4/2019 | Oh | |
| 2020/0114489 | A1 | 4/2020 | Reedy et al. | |
| 2020/0130134 | A1 * | 4/2020 | Chen | H01L 21/3212 |
| 2020/0398399 | A1 * | 12/2020 | Chen | B24B 37/32 |
| 2021/0249276 | A1 | 8/2021 | Oh et al. | |
| 2022/0339755 | A1 * | 10/2022 | Oh | H01L 21/687 |

FOREIGN PATENT DOCUMENTS

| | | | | |
|---|---|---|---|---|
| CN | 201151081 | | 11/2008 | |
| CN | 101331003 | | 12/2008 | |
| CN | 101987430 | | 3/2011 | |
| CN | 201856158 | | 6/2011 | |
| CN | 202579272 | | 12/2012 | |
| CN | 205799209 | | 12/2016 | |
| CN | 107953242 | | 4/2018 | |
| CN | 107953242 | A * | 4/2018 | |
| DE | 10247179 | | 4/2004 | |
| JP | S52-125188 | | 10/1977 | |
| JP | H07-237121 | | 9/1995 | |
| JP | H08-187657 | | 7/1996 | |
| JP | 2000-288923 | | 10/2000 | |
| JP | 2000288923 | A * | 10/2000 | |
| JP | 2001-345297 | | 12/2001 | |
| JP | 2002-326146 | | 11/2002 | |
| JP | 2002-326156 | | 11/2002 | |
| JP | 3098671 | | 10/2003 | |
| JP | 2004-056110 | | 2/2004 | |
| JP | 2005-005398 | | 1/2005 | |
| JP | 2008-511983 | | 4/2008 | |
| JP | 2009-050943 | | 3/2009 | |
| JP | 2010-036283 | | 2/2010 | |
| JP | 2010-505638 | | 2/2010 | |
| KR | 200328288 | | 9/2003 | |
| KR | 10-2006-0050785 | | 5/2006 | |
| KR | 10-0680880 | | 2/2007 | |
| KR | 10-2007-0027897 | A | 3/2007 | |
| KR | 20070027897 | A * | 3/2007 | B24B 37/32 |
| KR | 10-2008-0109119 | | 12/2008 | |
| KR | 10-2012-0095280 | | 8/2012 | |
| KR | 10-1224539 | | 1/2013 | |
| KR | 10-2015-0021991 | | 3/2015 | |
| TW | M493229 | | 7/2002 | |
| TW | 200609078 | | 3/2006 | |
| TW | 201039976 | | 11/2010 | |
| TW | 201302387 | | 1/2013 | |
| WO | WO 2004/023937 | | 3/2004 | |
| WO | WO 2006/025641 | | 3/2006 | |

OTHER PUBLICATIONS

European Search Report in European Appln. No. 16804163.0, dated Nov. 30, 2018, 9 pages.

(56) References Cited

OTHER PUBLICATIONS

International Search Report and Written Opinion in International Appln. No. PCT/US2016/034811, dated Sep. 1, 2016, 10 pages.
Machine English Translation of KR101224539 Published Jan. 21, 2013.
Machine Generated English Translation of JP08187657. Published Jul. 23, 1996 (Year: 1996).
Office Action in Chinese Application No. 201610366091.X, dated Mar. 18, 2020, 14 pages (with English Translation).
Office Action in Chinese Appln, No. 201610366091.X, dated Jul. 31, 2019, 11 pages (with English Translation).
Office Action in Chinese Appln. No. 202110032638.3, dated Mar. 3, 2022, 14 pages (with English translation).
Office Action in Japanese Appln. No. 2017-556245, dated May 12, 2020, 30 pages (with English translation).
Office Action in Japanese Appln. No. 2017-556245, dated Oct. 13, 2020, 8 pages (with English translation).
Office Action in Japanese Appln. No. 2021-087352, dated Jun. 28, 2022, 9 pages (with English translation).
Office Action in Japanese Appln. No. 2023-023132, dated May 21, 2024, 8 pages (with English translation).
Office Action in Korean Appln. No. 10-2017-7031231, dated Mar. 25, 2022, 9 pages (with English summary).
Office Action in Taiwanese Appln. No. 104112243, dated Jan. 16, 2019, 16 pages (with English translation).
Office Action in Taiwanese Appln. No. 105116687, dated May 22, 2019, 10 pages (with English Search Report).
Office Action in Taiwanese Appln. No. 105207947, dated Mar. 16, 2017, 6 pages (with English summary).
Zheng et al., "Design of Universal Fixture for Planetary Grinding and Polishing Machine," Mechanical & Electrical Technology, Jun. 30, 2010, 2: 55-56, 65 (with machine translation of Abstract).
Search Report in Singapore Appln. No. 10202400192P, dated Feb. 7, 2025, 2 pages.

* cited by examiner

RETAINING RING HAVING INNER SURFACES WITH FEATURES

CROSS-REFERENCE TO RELATED APPLICATIONS

This application is a divisional of U.S. application Ser. No. 17/945,932, filed on Sep. 15, 2022, which is a continuation of U.S. application Ser. No. 16/708,287, filed on Dec. 9, 2019, which is a divisional of U.S. application Ser. No. 14/992,763, filed on Jan. 11, 2016, which claims priority to U.S. Application No. 62/168,578, filed on May 29, 2015, which are incorporated by reference.

TECHNICAL FIELD

The present disclosure relates generally to chemical mechanical polishing of substrates, and more particularly to retaining rings for use in chemical mechanical polishing.

BACKGROUND

An integrated circuit is typically formed on a substrate by the sequential deposition of conductive, semiconductive or insulative layers on a silicon substrate. One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be needed to planarize a dielectric layer at the substrate surface for photolithography.

Chemical mechanical polishing (CMP) is one accepted method of planarization. This planarization method typically requires that the substrate be mounted on a carrier or polishing head of a CMP apparatus. The exposed surface of the substrate is placed against a rotating polishing disk pad or belt pad. The polishing pad can be either a "standard" pad or a fixed-abrasive pad. A standard pad has a durable roughened surface, whereas a fixed-abrasive pad has abrasive particles held in a containment media. The carrier head provides a controllable load on the substrate to push it against the polishing pad. A polishing slurry, including at least one chemically-reactive agent, and abrasive particles if a standard pad is used, is supplied to the surface of the polishing pad.

The substrate is typically retained below the carrier head by a retaining ring. However, because the retaining ring contacts the polishing pad, the retaining ring tends to wear away, and is occasionally replaced. Some retaining rings have an upper portion formed of metal and a lower portion formed of a wearable plastic, whereas some other retaining rings are a single plastic part.

SUMMARY

In one aspect, a retaining ring includes an annular body that has a top surface configured to be secured to a carrier head, a bottom surface configured to contact a polishing surface, an outer surface extending from the top surface at an outer top perimeter to the bottom surface at an outer bottom perimeter, and an inner surface extending from the top surface at an inner top perimeter to the bottom surface at an inner bottom perimeter. The inner surface includes a first portion adjacent the bottom surface and a second portion adjoining the first portion along a boundary. The first portion comprises seven or more facets. The inner bottom perimeter is defined by bottom edges of the facets. The second portion may include a frustoconical surface that is sloped downwardly from outside in.

Implementations may include one or more of the following features. The facets may be planar. Adjacent facets may be being connected at a straight side edge. The inner bottom perimeter may be defined by straight bottom edges of the planar facets. The boundary may include a plurality of curved edges corresponding to the plurality of facets, and each curved edge for a facet may have a lowest point at a horizontal center of the facet. The annular body may include an upper portion and a lower portion of a different material than the upper portion. A lowest point on each curved edge may be aligned to a boundary between the upper portion and the lower portion. The bottom surface may include channels extending from the outer surface to the inner surface. Each channel may have an end open to the inner surface of the body at a straight side edge. The inner surface may include a first number of facets and the bottom surface may have a second number of channels, and the first number may be a whole number multiple of the second number. The whole number may be three, four or five. The inner surface may have a total of 72 facets. The inner bottom perimeter may be is a regular polygon.

In another aspect, a retaining ring includes an annular body that has a top surface configured to be secured to a carrier head, a bottom surface configured to contact a polishing surface, an outer surface extending from the top surface at an outer top perimeter to the bottom surface at an outer bottom perimeter, and an inner surface extending from the top surface at an inner top perimeter to the bottom surface at an inner bottom perimeter. The inner surface includes a plurality of inwardly-extending projections, each projection having a flat innermost surface.

In another aspect, a retaining ring includes an annular body that has a top surface configured to be secured to a carrier head, a bottom surface configured to contact a polishing surface, an outer surface extending from the top surface at an outer top perimeter to the bottom surface at an outer bottom perimeter, and an inner surface extending from the top surface at an inner top perimeter to the bottom surface at an inner bottom perimeter. The inner surface includes a plurality of inwardly-extending projections, the projections providing the inner bottom perimeter with a serpentine path.

In another aspect, a method of forming a retaining ring includes joining an upper portion of the retaining ring having a frustoconical inner surface to a lower portion of the retaining ring having a cylindrical inner surface, and machining the inner surface of the lower portion and the inner surface of the upper portion to form a plurality of flat facets that intersect the frustoconical surface at a plurality of curved edges.

Implementations may include one or more of the following features. The inner surfaces may be machined such that a lowest point on each curved edge is aligned to a boundary between the upper portion and the lower portion. The inner surfaces may be machined such that a lowest point on each curved edge is above a boundary between the upper portion and the lower portion. Joining may include one or more of adhering with an adhesive, connecting with a mechanical fastener, or fixing with a dovetail joint.

In another aspect, a retaining ring includes an annular body that has a top surface configured to be secured to a carrier head, a bottom surface configured to contact a polishing surface, an outer surface extending from the top surface at an outer top perimeter to the bottom surface at an outer bottom perimeter, and an inner surface extending from the top surface at an inner top perimeter to the bottom surface at an inner bottom perimeter. The inner surface includes a plurality of regions spaced angularly around the annular body, the plurality of regions having different surface textures.

Implementations may include one or more of the following features. The plurality of regions may be arranged in a regular pattern. The different surface textures may include different roughnesses. The different roughnesses may include a first roughness having an Ra between 4 and 64 microinches and a second roughness that is less than the first roughness. The different surface textures may include surface grooving in different directions. The different directions may be perpendicular. One of the different directions may be parallel or perpendicular to the inner bottom perimeter. The different surface textures may include surface grooving having different depths.

In another aspect, a retaining ring includes an annular body that has a top surface configured to be secured to a carrier head, a bottom surface configured to contact a polishing surface, an outer surface extending from the top surface at an outer top perimeter to the bottom surface at an outer bottom perimeter, and an inner surface extending from the top surface at an inner top perimeter to the bottom surface at an inner bottom perimeter. The inner surface includes a plurality of regions spaced angularly around the annular body, the plurality of regions having different tilts relative to the bottom surface.

Implementations may include one or more of the following features. The plurality of regions may be are arranged in a regular pattern. One of the different tilts may be perpendicular to the bottom surface. The different tilts may include a first tilt that is slanted inwardly from bottom to top and a second tilt that is slanted outwardly from bottom to top.

Advantage may include the following. An edge of a substrate being polished can contact the retaining ring at multiple points. Thus pressure on the substrate edge can be distributed over a wider region, or rotation of the substrate can be improved. Consequently, the polished substrate can achieve better thickness uniformity, e.g., less angular asymmetry. The retaining ring can undergo lower wear, and consequently have a longer lifetime.

The details of one or more embodiments are set forth in the accompanying drawings and the description below. Other aspects, features and advantages will be apparent from the description and drawings, and from the claims.

DESCRIPTION OF DRAWINGS

Similar reference number in the drawings represent similar features.

DETAILED DESCRIPTION

A retaining ring in a CMP apparatus has an inner surface that confines movement of a substrate being polished by the CMP apparatus. In a conventional retaining ring, the inner surface has a circular perimeter. In contrast, some implementations of the retaining ring described herein have an inner surface formed of multiple planar facets, with adjacent facets joined at corners. Some implementations of the retaining ring described herein have a crenellated or serpentine inner surface, and/or an inner surface with alternating region of different surface properties or different tilt angles. This can improve the thickness uniformity of the polished substrate.

Figure 1:
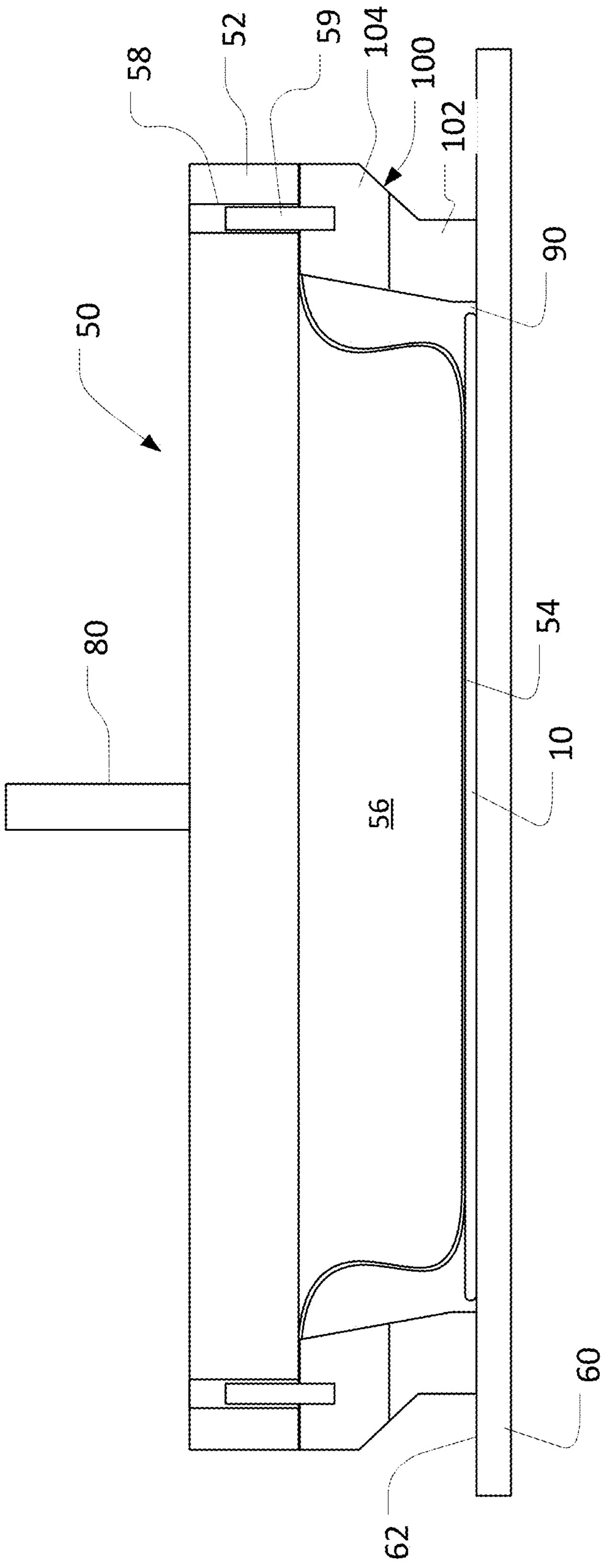
FIG. 1 is a schematic cross-sectional view of a carrier head.

Referring to FIG. 1, a retaining ring 100 is a generally an annular ring that can be secured to a carrier head 50 of a CMP apparatus. A suitable CMP apparatus is described in U.S. Pat. No. 5,738,574 and suitable carrier heads are described in U.S. Pat. Nos. 6,251,215, and 6,857,945. The retaining ring 100 fits into a loadcup for positioning, centering, and holding the substrate at a transfer station of the CMP apparatus.

As an example, FIG. 1 shows a simplified carrier head 50 onto which the retaining ring 100 is secured. The carrier head 50 includes a housing 52, a flexible membrane 54, a pressurizable chamber 56, and the retaining ring 100. The flexible membrane provides a mounting surface for a substrate 10. When the substrate 10 is mounted, the mounting surface can directly contact a back surface of the substrate. In the example shown in FIG. 1, the membrane 54 is clamped between the retaining ring 100 and the housing 52, but in some implementations, one or more other parts, e.g., clamp rings, can be used to hold the membrane 54.

The pressurizable chamber 56 is located between the membrane 54 and the housing 52 can be pressurized, e.g., using a fluid (gas or liquid), to push a front surface of the substrate 10 against a polishing surface 62 of a polishing pad 60 to polish the front surface. In some implementations, the pressure in the chamber 56, and thus the downward pressure of the flexible membrane 54 on the substrate 10, can be controlled using a pump (not shown) that is fluidly connected to the chamber 56 though a passage in the housing.

The retaining ring 100 is secured near the edge of the housing 52 to confine the substrate 10 below the membrane 54. For example, the retaining ring 100 can be secured by mechanical fasteners 58, e.g., screws or bolts, that extend through passages 59 in the housing 52 into aligned threaded receiving recesses in a top surface of the retaining ring 100. Additionally, the top surface can have one or more alignment apertures positioned to mate to a corresponding pin on the carrier head to allow proper alignment when the retaining ring 100 is secured to the carrier head.

A drive shaft 80 can be provided to rotate and/or translate the carrier head 50 across a polishing pad 60. In some implementations, the drive shaft 80 can be raised and lowered to control the pressure of a bottom surface of the retaining ring 100 on the polishing pad 60. Alternatively, the retaining ring 100 can be movable relative to the drive shaft 80 and the carrier head 50 can include an internal chamber which can be pressurized to control a downward pressure on the retaining ring 100, e.g., as described in U.S. Pat. Nos. 6,183,354 or 7,575,504.

Referring to FIGS. 2-5, a top surface 110 of the retaining ring 100 is mostly flat, but includes a plurality of threaded recesses 112 to receive the fasteners to hold the retaining ring 100 to the carrier head. Optionally, the top surface 110 can have one or more alignment features, e.g., recesses 114, positioned to mate to a corresponding features, e.g., projections, on the carrier head to allow proper alignment when the retaining ring 100 is secured to the carrier head. Optionally, the top surface can include a raised outer rim where the recesses for the fasteners are located. Optionally, the top surface can include a plurality of concentric ridges extending around the ring, e.g., to grip the membrane 54.

A bottom surface 120 of the retaining ring 100 is configured to contact the polishing surface of the polishing pad. Optionally, the bottom surface 120 can include channels 122 that extend partially through the thickness of the retaining ring 100. Other than the channels 122, the bottom surface 120 can be flat and can be parallel to the upper surface 110. In the example shown in FIGS. 2-5, the bottom surface 120 includes eighteen channels 122, although there can be a different number of channels, e.g., four to one hundred channels. In operation, the channels 122 permit a polishing fluid, such as slurry, which can include abrasives or be abrasive-free, to flow underneath the retaining ring 100 to the substrate.

The channels 122 can be generally straight, and extend from an inner surface 130 to an outer surface 140 of the retaining ring 100. The channels 122 can be distributed at equal angular intervals around the retaining ring 100. The channels 122 are typically oriented at an angle $\alpha$, e.g., between about 30° to about 60°, or about 45°, relative to a radial segment (R) extending through the center of the retaining ring 100 and the channel, but alternatively the channels 122 can extend along the radial segment (R), i.e., 0° angle.

Each channel 122 can have a width W (see, FIG. 5) of about 0.75 mm to about 25 mm, e.g., about 3.125 mm. The ratio of the width of the channel to the width of the spacing between channels can be between 10/90 and 50/50. The channels can have a uniform width along their radial length, or could vary in width along their radial length, e.g., be flared at the inner and/or outer diameter. The various channels 122 can all have the save width profile, or different channels can have different widths. Rather than a linear segment, the channels can be curved.

The sidewalls 124 of the channels 122 can be perpendicular to the bottom surface 120, or can be at an angle less than 90°, e.g., at angle of 45-85°, relative to the bottom surface 120. In some configurations, the edges 126 where the sidewalls 124 intersect the bottom surface 120, have a radius of curvature or a chamfer that is greater than about 0.1 mm but less than the height of the channel 122. The channels

Figure 7:
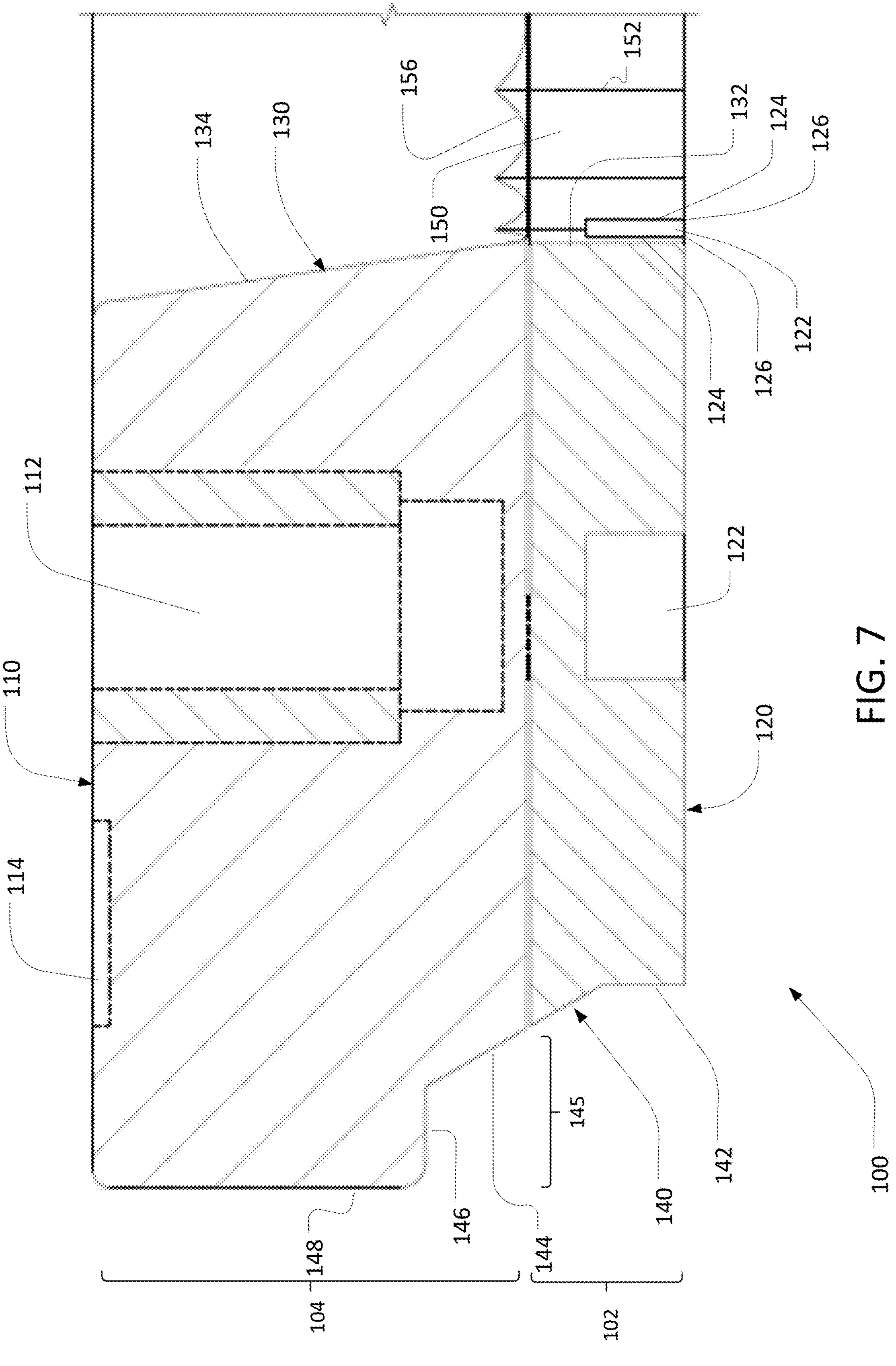
FIG. 7 is a schematic cross-sectional side view of the retaining ring of FIG. 2.

122 can have a depth that is between 25% and 90% of the thickness of a lower portion 102 of the retaining ring (see FIG. 7).

The total thickness of the retaining ring 100, e.g., between the top surface 110 and the bottom surface 120 can be about 12.5 mm to about 37.5 mm.

Figure 2:
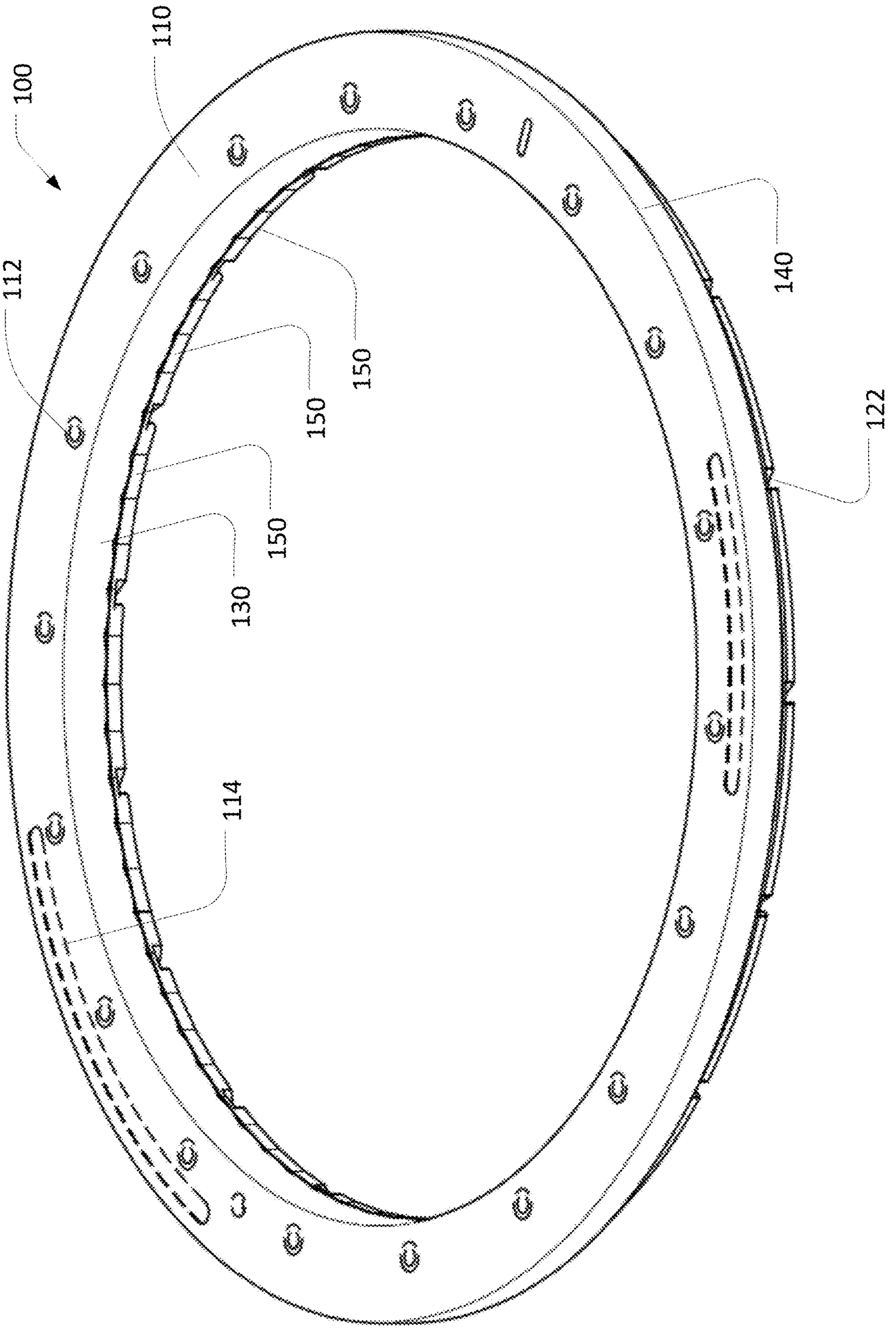
FIG. 2 is a schematic top perspective view of a retaining ring.
Figure 3:
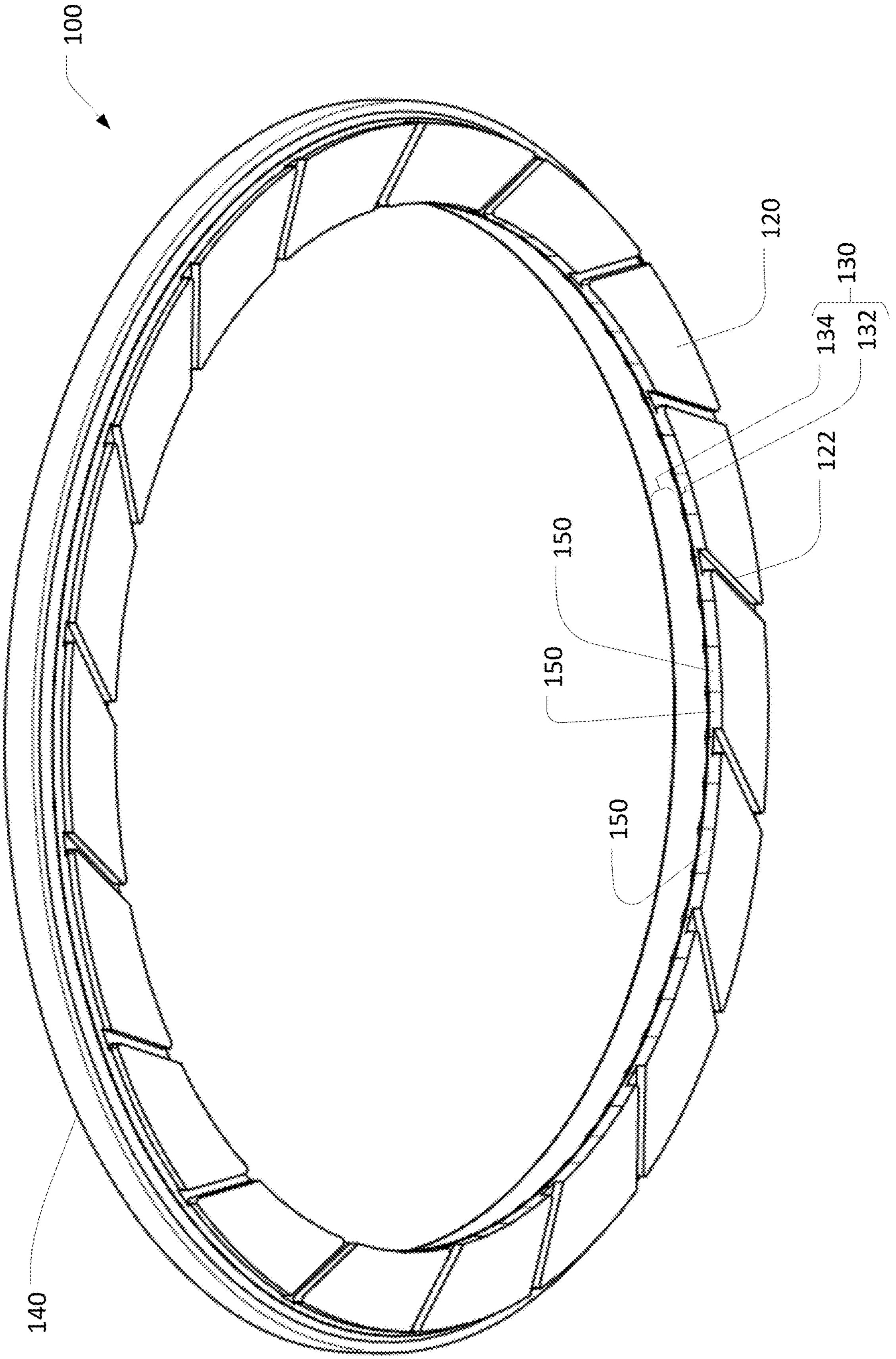
FIG. 3 is a schematic bottom perspective view of the retaining ring of FIG. 2.
Figure 4:
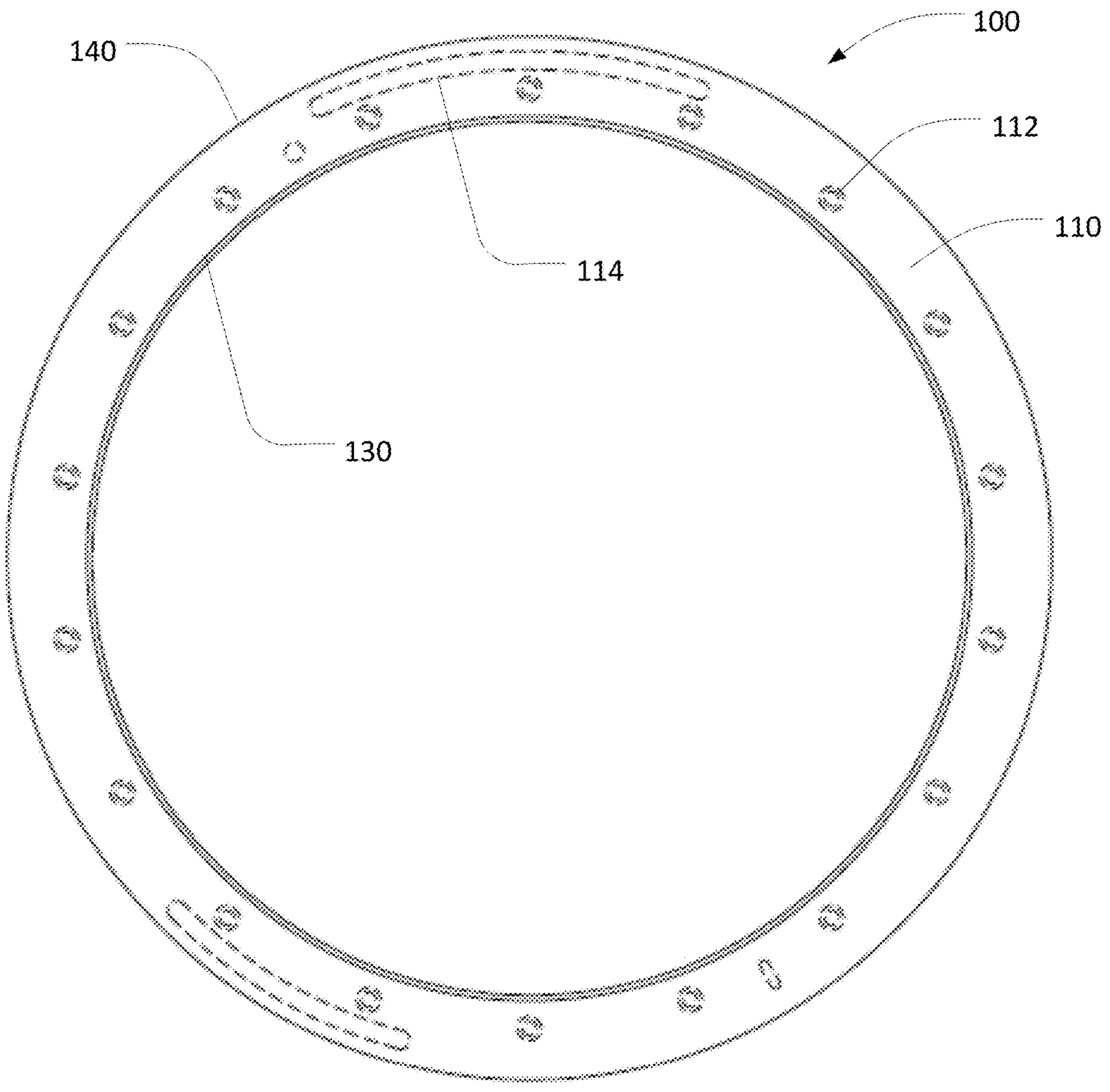
FIG. 4 is a schematic planar top view of the retaining ring of FIG. 2.
Figure 5:
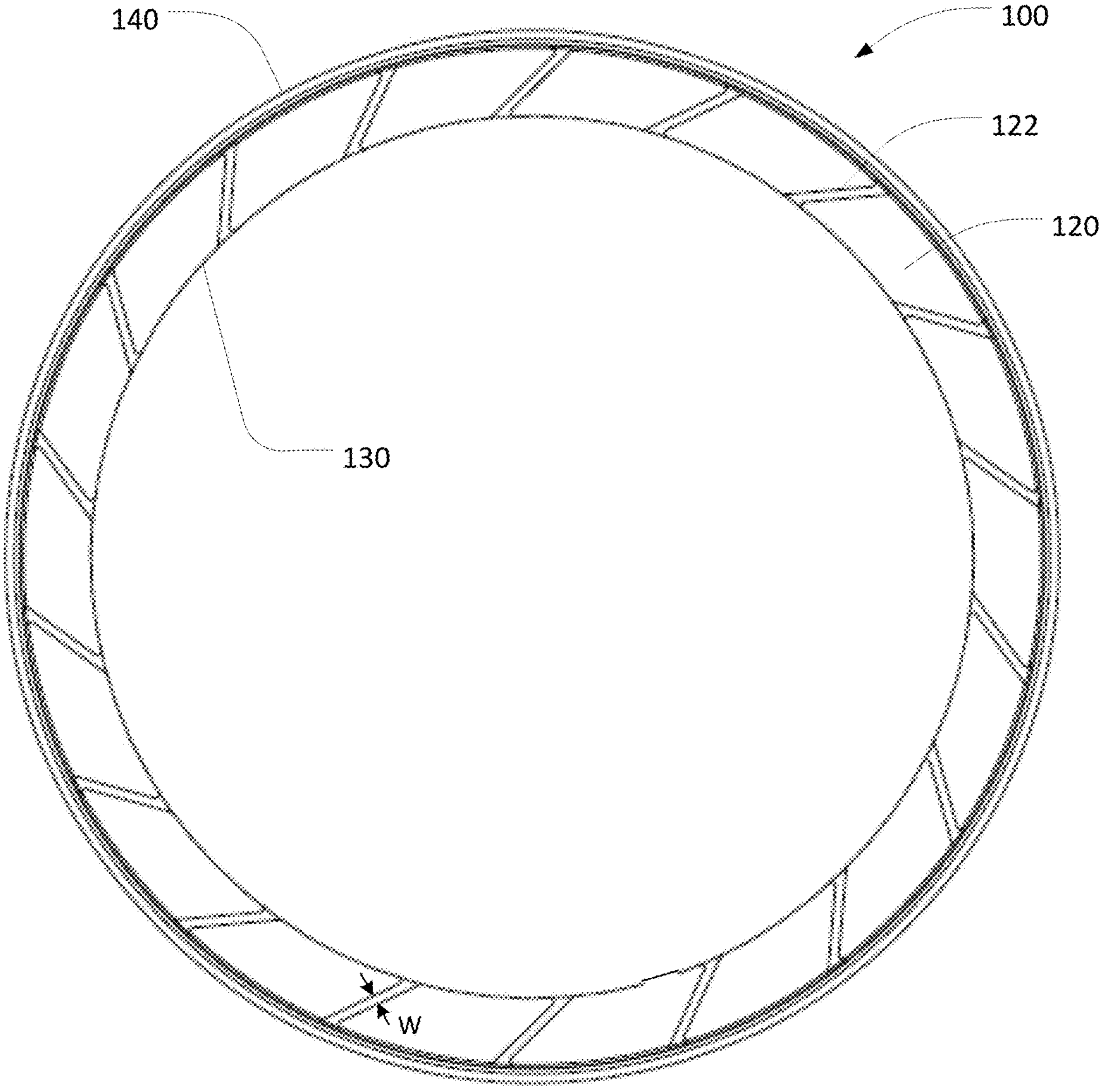
FIG. 5 is a schematic planar bottom view of the retaining ring of FIG. 2.

Referring to FIGS. 2, 3 and 7, at least a portion 142 of the outer surface 140 of the retaining ring 100 adjacent the bottom surface 120 can be a vertical cylindrical surface having a circular shape in a top or bottom planar view. In some implementations, the retaining ring 100 includes an overhanging portion 145; a bottom of the overhanging portion 145 defines a horizontal portion 146 of the outer surface 140. This horizontal portion 146 can provide a lip to assist with centering the retaining ring in a substrate loader or to provide a hard stop for the retaining ring against the top inner edge of a surrounding ring.

The outer surface 140 can include a sloped portion 144, e.g., a frustoconical surface angled downwardly from the outside in, that connects the vertical cylindrical portion 142 to the horizontal portion 146. A portion 148 of the outer surface 140 of the retaining ring 100 adjacent the top surface 110 can be a vertical cylindrical surface. The cylindrical portion 142 of the outer surface 140 adjacent the top surface 110 outer surface 140 can have a larger diameter than the cylindrical portion 142 adjacent the bottom surface 120.

Figure 6:
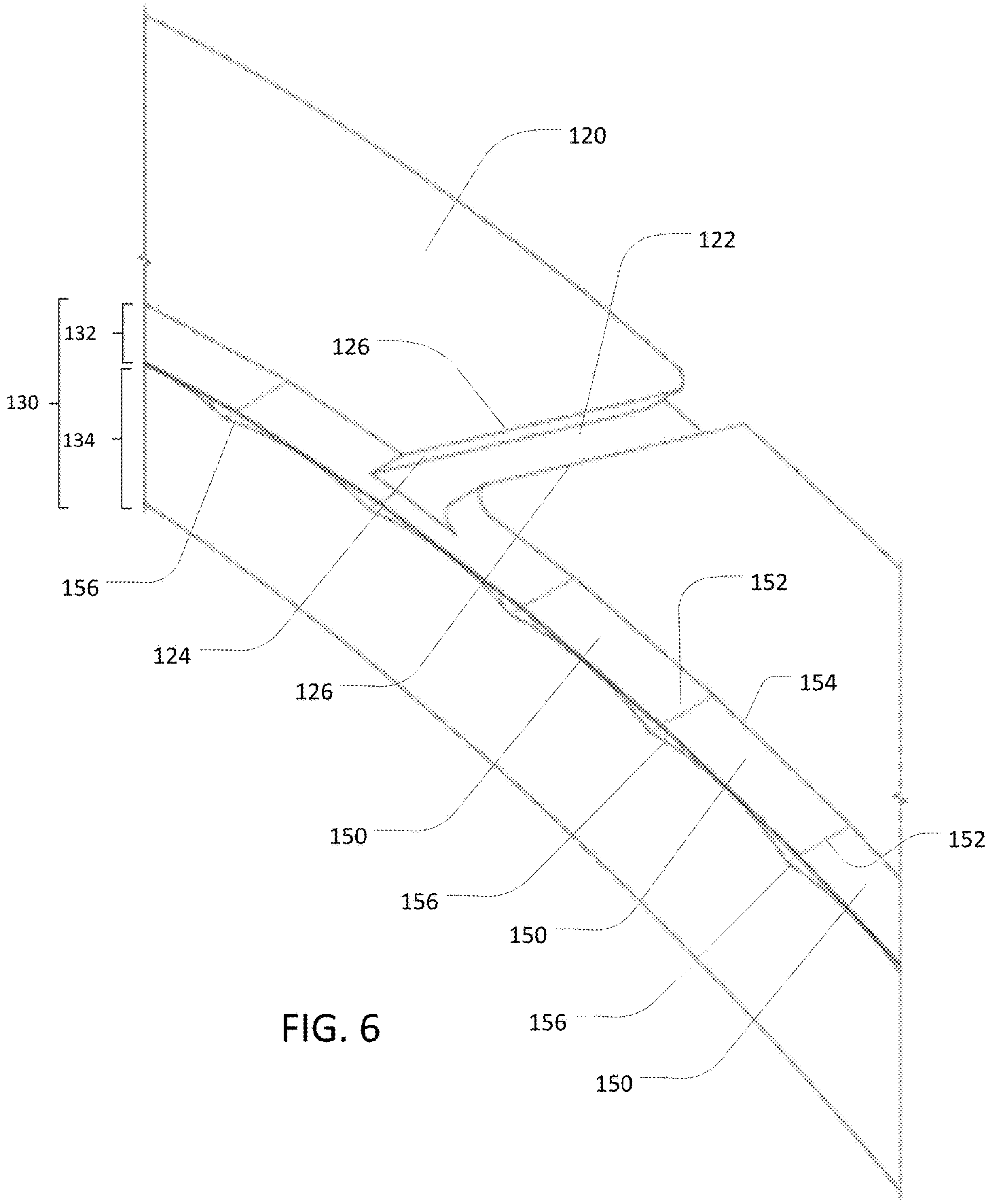
FIG. 6 is a schematic close-up perspective view of the retaining ring of FIG. 2.

Referring to FIGS. 2, 3, 6 and 7, instead of a cylindrical surface, the portion 132 of the inner surface 130 adjacent the bottom surface 120 is formed of multiple facets 150. Each facet is a flat vertical surface and joins an adjacent facet along a vertical edge 152. The flat vertical surface in each facet can be substantially perpendicular to the bottom surface 120. In some configurations, the thickness of the portion 132 in the vertical direction is greater than the depth of the channel 122, as shown in FIG. 6.

The facets 150 intersect the bottom surface 120 along straight lower edges 154. The straight edges 154 of the facets 150 along the bottom surface 120 connect to one another at the corners. Thus, in a bottom planar view, the connected lower edges 154 can form a polygon (the number of facets is large enough that this polygon structure is not visible in FIG. 5). The angle between each pair of adjacent facets can be the same, so that the connected lower edges 154 form a regular polygon.

In the example illustrated, the portion 132 of the inner surface 130 has seventy two facets 150. However, there the retaining ring 100 could have ten to one-hundred and fifty facets. For example, the retaining ring 100 could have twenty-five to one-hundred facets, e.g., sixty to eighty facets. In some implementations, the retaining ring 100 has seventy-two facets. An advantage of having about seventy-two facets is that it appears to provide superior polishing uniformity.

In the example illustrated, each facet 150 has the same width (distance along the lower edge 154). However, in some implementations, some facets have different widths than other facets. For example, the facets can be arranged with the wider facets arranged in a regular pattern, e.g., every other facet or every third facet. Similarly, in the example illustrated, each facet 150 has the same height, but in some implementations, some facets have different heights than other facets.

The number of facets 150 can be a whole number multiple of the number of channels 122. For example, one channel 122, may be provided for every two, three, four or five facets 150 on the inner surface 130. In some implementations, each channel 122 in the bottom surface 120 intersects the inner surface 130 at an edge 152 between adjacent facets 150. Alternatively, each channel 122 in the bottom surface 120 could intersect the inner surface 130 in a region formed between the edges 152 that define a particular facet 150, i.e., the channel does not overlap an edge 152 between adjacent facets 150. On average, the width of the bottom surface 120 of the retaining ring 100, i.e., the distance between the inner surface 130 and the outer surface 140, is about 2.5 cm to about 5.0 cm.

A portion 134 of the inner surface 130, located above the portion 132, has a circular cross-section in the plane parallel to the bottom surface 120. This portion 134 can be adjacent the top surface 110 and extend downwardly. This portion 134 can be sloped, e.g., be a frustoconical surface angled downwardly from the outside in.

Each flat facet 150 intersects the conical surface of the portion 134 along a curved edge 156. In particular, the facets 150 are taller at their adjoining edges 152 than at their lateral centers—i.e., equidistant from the opposite edges 152. That is, the curved edge 156 dips downwardly away from each edge 152, with a lowest point that is equidistant from the opposite edges 152 of the facet 150. Assuming the surface 134 is frustoconical and the facets 150 are vertical, then each curved edge 156 will define a hyperbolic curve.

Returning to FIG. 1, the inner surface 130 of the retaining ring 100, in conjunction with the lower surface of the flexible membrane 54, defines a substrate receiving recess 90. The retaining ring 100 prevents the substrate 10 from escaping the substrate receiving recess 90.

Generally, the substrate is circular and has a diameter of about 200 mm to about 300 mm. The size of the recess 90 in a top or bottom planar view is generally larger than surface area of the substrate 10 such that the substrate 10 can move its position relative to the retaining ring 100. For the purpose of discussion, an inner radius (IR) of the retaining ring 100 is defined in the planar view of the retaining ring to be a distance between the center C of the retaining ring 100 to a center point of a facet 150 that is equidistant between two opposite edges 152. The inner diameter (twice the inner radius IR) is slightly larger the substrate radius, e.g., by about 1 to 5 mm. For example, for a 300 mm diameter substrate, the retaining ring can have an inner diameter of about 301 to 305 mm.

During a polishing process, the carrier head 50, including the retaining ring 100, moves relative to the polishing pad 60. Friction of the polishing pad 60 against the substrate 10 forces the substrate 10 against the inner surface 130 of the retaining ring 100. Due to the faceted structure, for at least some periods of time, the substrate 10 contacts at least two facets 150 of the inner surface 130.

However, because the radius of the substrate 10 is smaller than the radius of the inner surface 130 of the retaining ring 100, the substrate 10 and the inner surface 130 have different angular velocities. As a result, the pair (or tuple, etc.) of facets 150 that contact the substrate 10 will shift over time. In other words, the retaining ring 100 rotates relative to the substrate 10.

The wear of the inner surface 130 of the retaining ring 100 can be reduced or be distributed more evenly around the retaining ring as compared to a retaining ring having a cylindrical inner surface that contacts the substrate 10. Without being limited to any particular theory, when the inner surface of a retaining ring is cylindrical, a substrate having a circular outer perimeter contacts the inner surface at a single location. In contrast, the multiple contacts can permit the force of the substrate 10 against the inner surface 130 to be distributed more widely, thus reducing the total force at any specific point and reducing the wear. The reduced wear can allow the retaining ring to have an increased life expectancy.

Again without being limited to any particular theory, during the relative movement between the retaining ring 100 and the substrate 10, the substrate makes no direct point-to-point contact with any of the channels 132 or channel openings located at the edges 152 between the facets 150. Generally, the channels 130 can form high stress areas in the retaining ring 100, where the retaining ring tends to be damaged or break more easily than other parts of the ring. By eliminating direct point-to-point contacts between the channels 130 and the substrate 10, the high stress areas can be protected from direct impact of the substrate 10, and the likelihood of damage to the retaining ring can be reduced. As a result, the wear of the retaining ring is reduced and the retaining ring can be used for a longer period of time.

In some polishing processes, the relative movement between the substrate 10 and the retaining ring 100 can reduce asymmetry in a polished substrate and improve within-wafer uniformity. In a polished substrate with asymmetry, the polished substrate has a thickness variation that varies with the angular coordinate. Again without being limited to any particular theory, as compared to a single contact situation, the multiple contacts between the substrate 10 and the retaining ring 100 can allow the substrate 10 to rotate relative to the carrier head 50, thus angularly spreading the effect of any asymmetric pressure distribution from the carrier head 50, and thereby reducing the likelihood or amount of asymmetry.

At least a lower portion 102 of the retaining ring 100 with the bottom surface 120 can be formed from a material that is chemically inert to the CMP process. The material should be sufficiently elastic that contact of the substrate edge against the retaining ring 100 does not cause the substrate to chip or crack. However, the material should not be so elastic as to extrude into the substrate receiving recess when the carrier head puts a downward pressure on the retaining ring 100. The material of the lower portion 102 should also be durable and have a low wear rate, although it is acceptable for the lower portion 102 of the retaining ring 100 to wear away.

For example, the lower portion 102 of the retaining ring 100 can be made of a plastic that is chemically inert in a CMP process. The plastic can have a durometer measurement of about 80-95 on the Shore D scale. In general, the elastic modulus of the plastic can be in the range of about $0.3\text{-}1.0\times10^6$ psi. Suitable plastic can include (e.g., consist of) polyphenylene sulfide (PPS), polyaryletherketone (PAEK), polyetheretherketone (PEEK), polyethylene terephthalate (PET), polybutylene terephthalate (PBT), polytetrafluoroethylene (PTFE), polybenzimidazole (PBI), polyetherimide (PEI), polyetherketoneketone (PEKK), polybutylene naphthalete (PBN), polyvinyl chloride (PVC), polycarbonate, a combination of one or more of these plastics, or a composite material, e.g., one or more of these plastics and a filler, for example, glass or carbon fibers. An advantage of polyphenol sulfide (PPS) is that it is reliable and commonly used material for retaining rings.

An upper portion 104 of the retaining ring 100 can be made of a material that is at least as rigid as the lower portion 102. In some implementations, the upper portion 104 can be made of a material that is more rigid than the lower portion 102. For example, the upper portion 104 can be a metal, e.g., aluminum or stainless steel, or a ceramic material, or a plastic that is more rigid than the plastic of the lower portion 102. In some implementations, the upper portion 104 has about the same rigidity as the lower portion, e.g., within 2%, but is of lower quality, e.g., a greater rate of contaminants, internal defects such as inclusions or voids, and is thus less expensive.

An adhesive, e.g., an epoxy can be used to join the lower portion 102 to the upper portion 104. Alternatively or in addition, mechanical fasteners and/or a dovetail joint could be used to join the lower portion 102 to the upper portion 104.

In some implementations, the lowest point on the curved edge 156 between a facet 150 and the conical portion 134 of the inner surface can be aligned, i.e., at the same height, as the boundary between the upper ring 104 and the lower ring 102. However, in some implementations the lowest point on the curved edge 156 is above the boundary between the upper ring 104 and the lower ring 102.

To fabricate the retaining ring, the upper ring 104 can be formed with the frustoconical inner surface 134, and the lower ring 102 can be formed with a vertical cylindrical surface. The lower ring 102 is joined to the upper 104. Then the inner surface 130 is machined to form the facets 150. The upper ring 104 and the lower ring 102 can be formed by machining an appropriate block of material, or by injection molding.

The retaining ring 100 can also have other features or features alternative to those discussed above. In some implementations, the retaining ring 100 has one or more through holes that extend horizontally or at a small angle from horizontal through the body of the retaining ring from the inner surface to the outer surface for allowing fluid, e.g., gas or liquid, to pass from the interior to the exterior, or from the exterior to the interior, of the retaining ring during polishing. The through-holes can be evenly spaced around the retaining ring.

In some implementations, one or more surfaces of the retaining ring, e.g., the inner surface 130 and/or the outer diameter surface 140 can be coated with a film. The film can be a hydrophobic or hydrophilic film, and/or can serve as a protective film. For example, the film can be polytetrafluoroethylene (PTFE) or diamond-like carbon.

In addition to the flat faceted regular polygon described with respect to FIGS. 1-7, the inner surface of the retaining ring can have other geometries. For example, referring to FIGS. 8-12, the inner surface 130 of the retaining ring can have a plurality of inwardly-extending projections 200. The projections can extend from a circle with a first radius R1, inwardly to a circle with a smaller second radius R2 (shown in FIG. 8). Examples of geometries for the inner surface 130 include zig-zag, crenellated, trapezoidal and sinusoidal, although other geometries are possible. There can be seven to one-hundred and fifty projections spaced around the inner surface of the retaining ring. The projections can be spaced at equal angular intervals around the retaining ring. Alternatively, the spacing between projections can vary, e.g., in a regular pattern.

Figure 8:
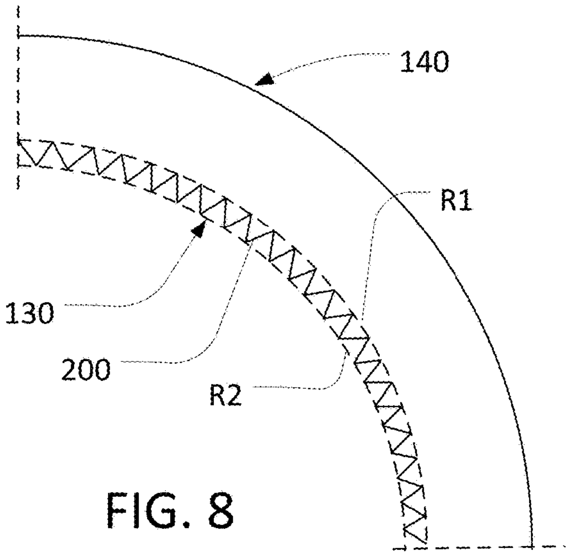
FIGS. 8-12 are schematic cross-sectional planar views of a portion of a retaining ring having other geometries for the interior surface.
Figure 10:
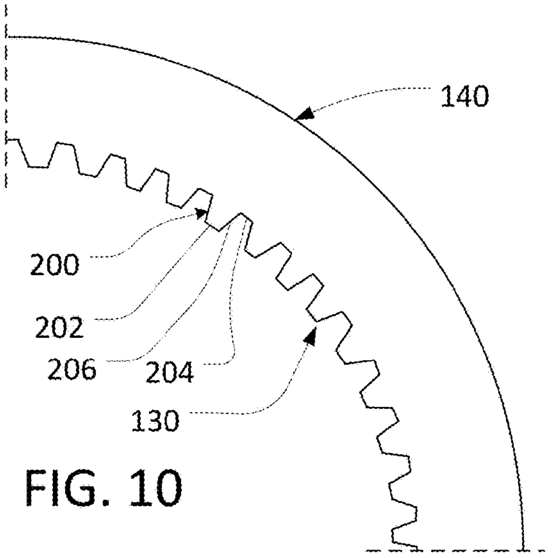

For some implementations, e.g., as shown in FIGS. 8 and 10, each projection can be joined at its edges to its immediate adjacent projections. For example, the region between each pair of adjacent projections can include no flat or arced surface that is substantially tangent to the circle defined by the first radius R1. FIG. 8 illustrates the projections as triangular, but other geometries such as trapezoidal (shown in FIG. 10), sinusoidal (shown in FIG. 12) and semicircular are possible. In addition, the inner tip of each projection and/or the intersection between each projection can be rounded.

Figure 9:
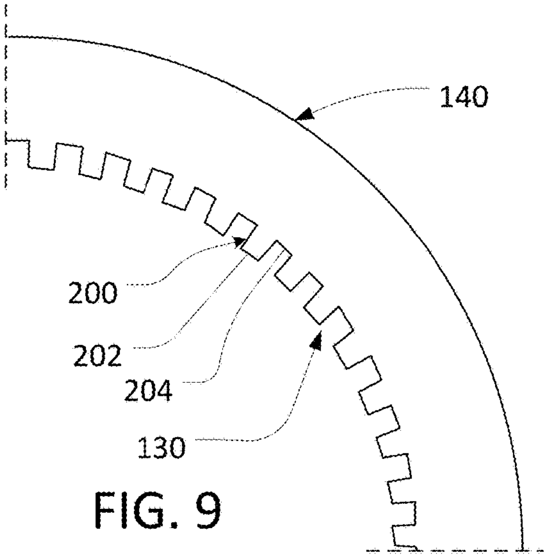
Figure 11:
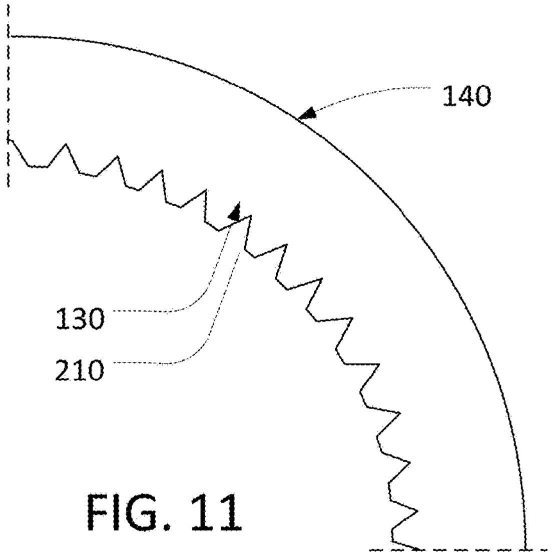

For some implementations, e.g., as shown in FIGS. 9-11, the innermost portion of each projection 200 can be a flat surface 202, e.g., a flat facet, at the inner second radius R2. For example, referring to FIG. 9, the projections 200 form a crenellated geometry, with the flat surface 202 and flat side surfaces 206. A flat or curved region 204 of the inner surface can separate each projection 200 at the outer first radius R1. For the crenellated geometry, each flat surface 202 can intersect its adjacent flat side surface 206 at about a 90° angle, e.g., at an able of 85-90°.

Referring to FIGS. 10-11, the projections 200 are trapezoidal, with flat inner surface 202 and flat side surfaces 206. For the trapezoidal projections 200, the angle between the flat outer surface 202 and the flat side surface 206 can be 115-145°. In FIG. 10, the projections 200 are separated at the outer first radius R1 by flat or curved regions 204, whereas in FIG. 11, each projection 200 is joined at its edges to its immediate adjacent projections without the flat or curved region 204.

Figure 12:
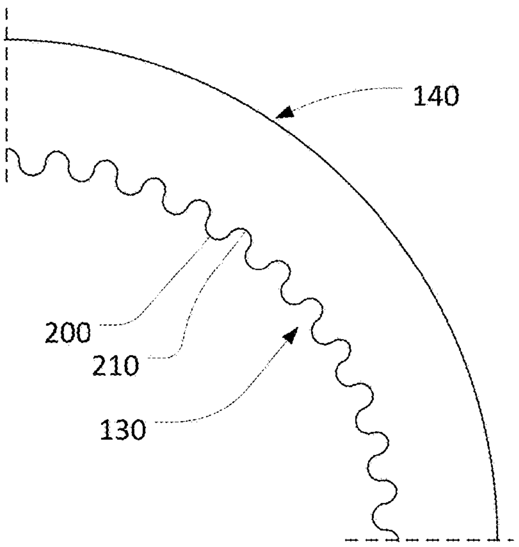

Referring to FIG. 12, the projections 200 can form an undulating surface, e.g., the bottom inner edge can form a serpentine path. Each projection can be a substantially sinusoidal curve. A potential advantage of this implementation is that the lack of sharp corners between the projections can reduce the likelihood of slurry sticking and drying in the corners, thus potentially reducing defects.

Figure 13:
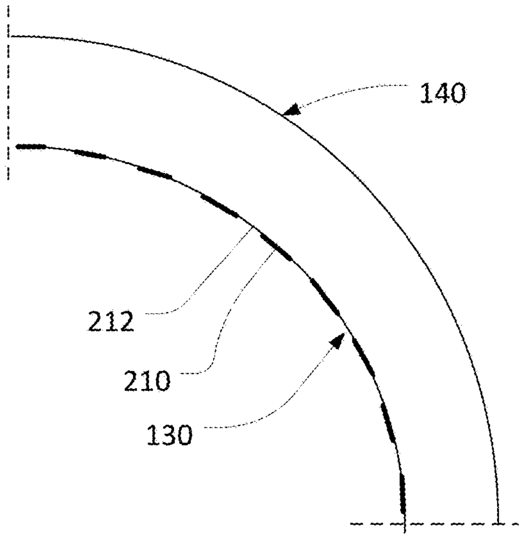
FIG. 13 is a schematic cross-sectional planar view of a portion of a retaining ring having an inner surface with regions of different surface texture.

Referring to FIG. 13, portions of the inner surface 130 can have different surface texture, e.g., different surface roughness, or surface grooving in different directions, e.g., vertical versus horizontal grooving, or surface grooving with different depths. For example, the inner surface 130 can include arc segments 210 that have a different surface texture than arc segments 212. In some implementations, the portions, e.g., arc segments, with different surface texture are arranged in a regular pattern, e.g., an alternating pattern, such as alternating between smooth and rough, or alternating between horizontal and vertical grooving. There can be seven to one-hundred and fifty portions spaced around the inner surface of the retaining ring. The portions can be spaced at equal angular intervals around the retaining ring. Alternatively, the spacing of the portions can vary, e.g., in a regular pattern. Each portion can have the same arc length, although this is not required.

For example, the arc segments 212 can be rougher than the arc segments 210. For example, the arc segments 212 can have an Ra roughness of 4 to 2000 micro-inches, e.g., 8 to 64 micro-inches, whereas the arc segments 210 can have an Ra roughness down to about 2 micro-inches.

Figure 14:
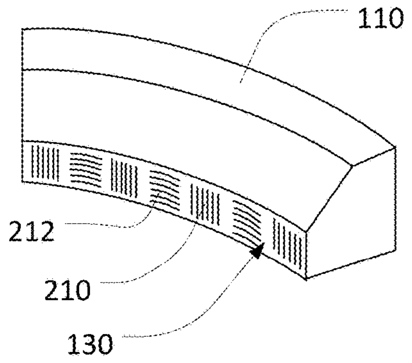
FIG. 14 is a schematic perspective view of a portion of a retaining ring having an inner surface with regions of different surface texture.

As another example, referring to FIG. 14, the arc segments 212 can have grooving in a different direction than the arc segments 210. The grooving direction of the arc segments 212 can be perpendicular to the grooving direction of the arc segments 210, although other angles, e.g., 20° to 90°, are possible. In some implementations, e.g., as shown in FIG. 13, arc segments 210, 212 alternate between horizontal and vertical grooving. However, other orientations are possible, e.g., alternating between slanted diagonal-left and slanted diagonal-right. In addition, more complex patterns of three or more surface textures are possible.

The different surface textures described above can be applied to the facets 150 or the projections 200 of the embodiment discussed above. Thus, different facets 150 and projections 200 can have different surface texture, e.g., different surface roughness, or surface grooving in different directions. Again, in some implementations, the facets or projections with different surface texture are arranged in a regular pattern, e.g., an alternating pattern, such as alternating between smooth and rough texturing, or alternating between horizontal and vertical grooving.

Although in the various embodiments above the portion 132 of the inner surface 130 that is adjacent the bottom surface 120 is vertical (perpendicular to the polishing surface), this portion 132 of the inner surface 130 could be tilted, e.g., at an angle up to 30° off vertical.

Figure 15:
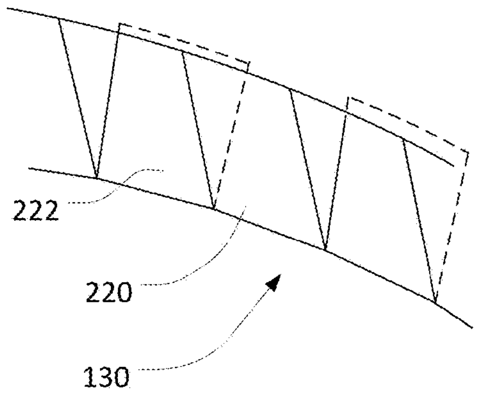
FIG. 15 is a schematic perspective view of a portion of a retaining ring having an inner surface with regions of different inclination.

In addition, referring to FIG. 15, the portion 132 of the inner surface 130 that is adjacent the bottom surface 120 can have portions with different inclination. For example, the inner surface 130 can include facets or arc segments 220 that have a different angle of tilt relative to the horizontal plane than facets or arc segments 222. In some implementations, the portions, e.g., facets or arc segments, are arranged in a regular pattern, e.g., an alternating pattern. For example, as shown in FIG. 15, the facets or arc segments 220 are tilted outwardly (from bottom to top), whereas the facets or arc segments 222 are tilted inwardly (from bottom to top). However, other combinations are possible, e.g., vertical versus tilted, or small tilt angle versus large tilt angle. There can be seven to one-hundred and fifty portions spaced around the inner surface of the retaining ring. The portions can be spaced at equal angular intervals around the retaining ring, or the spacing of the portions can vary, e.g., in a regular pattern.

The different tilt angles of the surface described above can be applied to the facets 150 or the projections 200 of the embodiment discussed above. Thus, different facets 150 and projections 200 can have different tilt angles. The variations in tilt angle can also be combined with the variations in surface texture.

Figure 16:
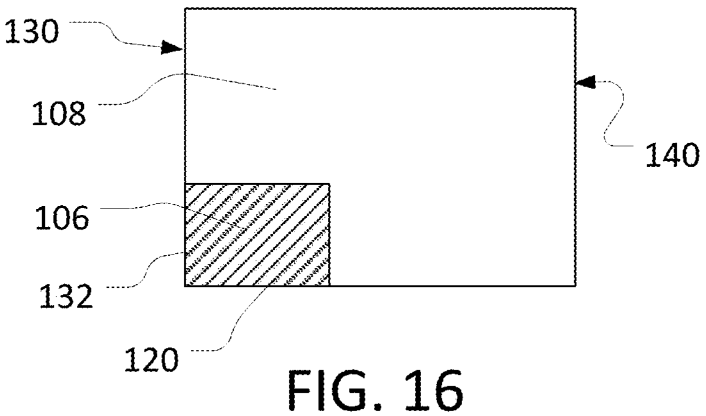
FIG. 16 is a schematic cross-sectional side view of retaining ring having an insert to provide the inner surface that contacts the substrate.

Referring to FIG. 16, the portion of the retaining ring having the inner surface 132 that contacts the substrate can be an insert 106 that fits into a recess in a ring 108 that extends both above and radially outward of the insert 106. If the inner surface 132 becomes damaged or worn from extended use, the insert 106 can be replaced with a new insert 106.

The retaining ring can be formed of two or more stacked regions of different materials, or be a single unitary ring of homogenous composition, e.g., a solid plastic ring. The channels, if present, can be aligned to regular points of the features, or different channels can intersect different points on the features. The channels, if present, can cover anywhere from 5% to 90% of the bottom surface of the retaining ring. The outer surface of the retaining ring can include steps or lips, or be a single vertical cylindrical or frustoconical surface. The concepts are applicable to retaining ring of different sizes, e.g., retaining rings for substrates of 4 to 18 inch diameter, or larger.

A number of embodiments of the invention have been described. Nevertheless, it will be understood that various modifications may be made without departing from the spirit and scope of the invention. Accordingly, other implementations are within the scope of the following claims.

What is claimed is:

1. A retaining ring comprising:

an annular body including a top surface configured to be secured to a carrier head;

a bottom surface configured to contact a polishing surface;

an outer surface extending from the top surface at an outer top perimeter to the bottom surface at an outer bottom perimeter; and an inner surface extending from the top surface at an inner top perimeter to the bottom surface at an inner bottom perimeter, the inner surface comprising a plurality of regions spaced angularly around the annular body, wherein the plurality of regions comprise at least first regions and second regions, wherein each of the first regions is tilted at a first tilt angle with respect to the bottom surface, wherein each of the second regions is tilted at a second tilt angle with respect to the bottom surface, and wherein the first tilt angle is different from the second tilt angle.

2. The retaining ring of claim 1, wherein the plurality of regions are arranged in a regular pattern.

3. The retaining ring of claim 2, wherein the first regions and the second regions alternate with each other around the annular body.

4. The retaining ring of claim 2, wherein the plurality of regions are spaced at equal angular intervals around the retaining ring.

5. The retaining ring of claim 1, wherein at least one of the first tilt angle or the second tilt angle is a right angle.

6. The retaining ring of claim 1, wherein the first regions are slanted inwardly from bottom to top and the second regions are slanted outwardly from bottom to top.

7. The retaining ring of claim 1, wherein the first tilt angle and the second tilt angle are up to 30° off vertical.

* * * * *